US 8,686,422 B2

(12) United States Patent
Yoshida et al.

(10) Patent No.: US 8,686,422 B2
(45) Date of Patent: Apr. 1, 2014

(54) ACTIVE MATRIX SUBSTRATE AND ACTIVE MATRIX DISPLAY DEVICE

(75) Inventors: Masahiro Yoshida, Osaka (JP); Isao Ogasawara, Osaka (JP); Shinya Tanaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 302 days.

(21) Appl. No.: 13/383,218

(22) PCT Filed: Apr. 2, 2010

(86) PCT No.: PCT/JP2010/002460
§ 371 (c)(1),
(2), (4) Date: Jan. 10, 2012

(87) PCT Pub. No.: WO2011/007479
PCT Pub. Date: Jan. 20, 2011

(65) Prior Publication Data
US 2012/0112197 A1 May 10, 2012

(30) Foreign Application Priority Data
Jul. 16, 2009 (JP) ................................ 2009-167879

(51) Int. Cl.
*H01L 29/786* (2006.01)
*G09G 3/36* (2006.01)
*G02F 1/1345* (2006.01)
*H01L 27/32* (2006.01)

(52) U.S. Cl.
CPC ............ *G09G 3/3674* (2013.01); *G09G 3/3677* (2013.01); *G02F 1/13452* (2013.01); *G02F 1/13454* (2013.01); *G02F 1/13458* (2013.01); *H01L 27/3276* (2013.01); *H01L 27/3241* (2013.01)
USPC ........ 257/59; 257/72; 257/E29.273; 438/151; 438/155; 345/204; 345/205; 349/43; 349/151; 349/152

(58) Field of Classification Search
CPC ............ G02F 1/13452; G02F 1/13454; G02F 1/13458; G09G 3/3674; G09G 3/3677; H01L 27/3241; H01L 27/3276
USPC .............. 257/59, 72, E29.273; 438/151, 155; 345/204, 205; 349/43, 151, 152
See application file for complete search history.

(56) References Cited

U.S. PATENT DOCUMENTS

| 7,379,148 B2 | 5/2008 | Kim |
| 2001/0050799 A1 | 12/2001 | Murade |

(Continued)

FOREIGN PATENT DOCUMENTS

| JP | 2002-040486 A | 2/2002 |
| JP | 2004-062160 A | 2/2004 |

(Continued)

OTHER PUBLICATIONS

Official Communication issued in International Patent Application No. PCT/JP2010/002460, mailed on Apr. 27, 2010.

(Continued)

*Primary Examiner* — Ermias Woldegeorgis
(74) *Attorney, Agent, or Firm* — Keating & Bennett, LLP

(57) ABSTRACT

A stem wiring (13a) having a broad line width is formed above branch wirings (13b) having a narrow line width. In a region where the stem wiring (13a) is connected to the branch wiring (13b), the stem wiring (13a) overlaps with the branch wiring (13b) via a gate insulating film when seen in a plan view, a contact hole is provided in the gate insulating film so as to uncover the branch wiring (13b), and the stem wiring (13a) is electrically connected to the branch wiring (13b) via a connecting conductor formed in the contact hole. Consequently, a TFT array substrate can be achieved, in which a disconnection failure or an abnormal line width is reduced without enlarging the dimension of a driving circuit region.

17 Claims, 12 Drawing Sheets

(56) References Cited

U.S. PATENT DOCUMENTS

| | | |
|---|---|---|
| 2003/0016308 A1* | 1/2003 | Jeon .............................. 349/39 |
| 2003/0222311 A1 | 12/2003 | Kim |
| 2004/0012058 A1 | 1/2004 | Aoki |
| 2005/0263762 A1* | 12/2005 | Kim .............................. 257/66 |
| 2006/0056267 A1* | 3/2006 | Kim et al. ................ 365/230.06 |
| 2008/0018572 A1* | 1/2008 | Shin et al. ...................... 345/87 |
| 2009/0091671 A1 | 4/2009 | Tsubata et al. |
| 2011/0291097 A1 | 12/2011 | Ogasawara et al. |

FOREIGN PATENT DOCUMENTS

| | | |
|---|---|---|
| JP | 2005-527856 A | 9/2005 |
| WO | 2008/010334 A1 | 1/2008 |
| WO | 2010/092714 A1 | 8/2010 |

OTHER PUBLICATIONS

Shimada et al., "Display Panel and Display Apparatus," U.S. Appl. No. 13/504,133, filed Apr. 26, 2012.

* cited by examiner

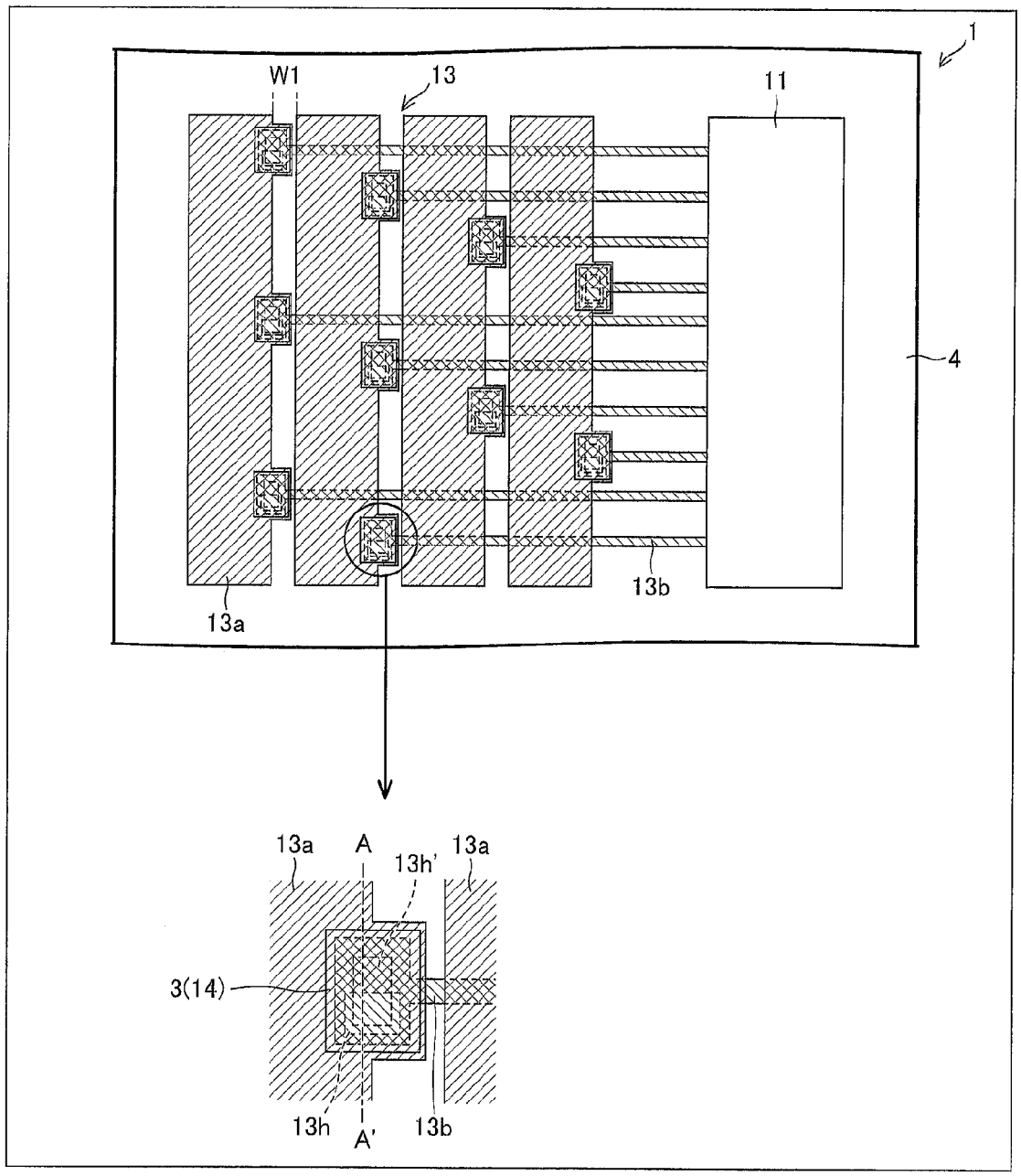

F I G. 1 3
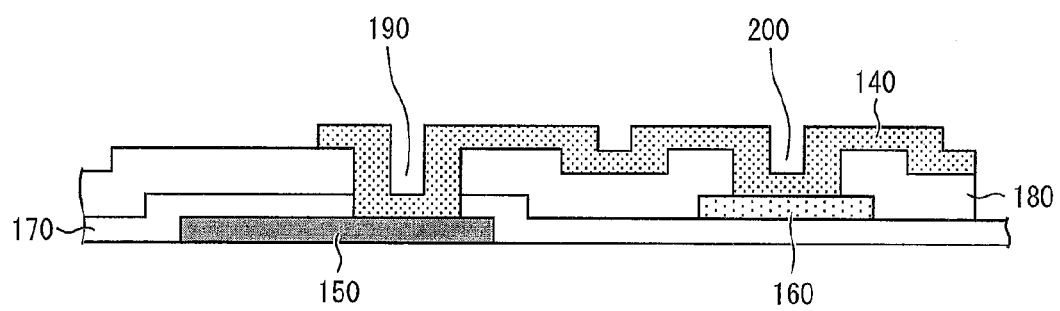

ACTIVE MATRIX SUBSTRATE AND ACTIVE MATRIX DISPLAY DEVICE

TECHNICAL FIELD

The present invention relates to an active matrix substrate in which a driving circuit and wirings thereof are monolithically formed, and to an active matrix display device using the substrate.

BACKGROUND ART

Recently, an active matrix display device using active elements such as TFTs, notably a liquid crystal display device and an organic EL display device which are rapidly spreading as an alternative to a cathode-ray tube (CRT), is widely used in a television, a monitor, a mobile phone and the like, taking advantage of its characteristics such as energy saving, thin-typed, lightweight and the like.

In particular, some liquid crystal display devices integrated in medium and small electronic apparatuses such as mobile phones and notebook computers began to adopt a gate driver monolithic (GDM) technology using amorphous silicon in order to realize a reduction of manufacturing costs. The application of such a gate driver monolithic (GDM) technology is expanding from medium and small electronic apparatuses to large-scale apparatuses such as a television.

For example, Patent Literature 1 describes a substrate for a liquid crystal display device in which pixel transistors in a display region and various types of transistors in a gate driving circuit region are formed with amorphous silicon thin films.

In the display region of the substrate for a liquid crystal display device, a drain electrode of the pixel transistor and a pixel electrode are electrically connected via a contact hole formed on a passivation film. The display region thus has a structure in which the pixel electrode is provided on the passivation film, which is a so-called "Pixel on Passivation" structure. The pixel transistor is formed as a bottom-gate transistor.

Also the gate driving circuit region of the substrate for a liquid crystal display device, as illustrated in FIG. 13, has a structure in which an electrode 140 of a same layer as the pixel electrode is formed on a passivation film 180 in order to electrically connect a main wiring 150 to a branch wiring 160, which will be explained in detail later.

Patent Literature 1 teaches that the driving circuit and wirings thereof to be formed in the gate driving circuit region are produced simultaneously with the display region by using a five (or four) mask production process, which process is generally used for producing only the display region, so that the gate driving circuit region can be integrated onto the substrate without an additional process, thereby making it possible to lower the production cost.

The configuration of the gate driving circuit region of the substrate for a liquid crystal display device will be described below with reference to FIGS. 12 to 13.

FIG. 12 is a plane view illustrating the gate driving circuit region of the substrate for a liquid crystal display device.

As illustrated in FIG. 12, driving transistors for shift registers are formed in that portion of the gate driving circuit region (in the right edge in FIG. 12) which is proximal to a display region (not-illustrated). A wiring region where a plurality of the main wirings 150 for applying a signal to respective ones of the shift registers are formed is provided in a vicinity of that portion of the gate driving circuit region, which is located distally from the display region.

Further, control transistors are formed in a region between the wiring region and the region where the driving transistors are formed.

The branch wirings 160 which connect the main wiring 150 to the driving transistor and the control transistor of the respective shift registers are formed of a different layer from that of the main wirings 150. According to the configuration of Patent Literature 1, the main wirings 150 are formed of the same layer as gate wiring patterns (gate patterns), while the branch wirings 160 are formed of the same layer as data wiring patterns (data patterns).

FIG. 13 is a cross-sectional view taken along the line C-C' in FIG. 12, illustrating a connection part of the main wiring 150 to the branch wiring 160.

As illustrated in FIG. 13, an insulating film 170 is provided between the main wiring 150 and the branch wiring 160, and the passivation film 180 is further provided so as to cover the branch wiring 160 and the insulating film 170.

A hole formed in the insulating film 170 and the passivation film 180 so as to partially uncover the main wiring 150 is defined as a first contact hole 190, and a hole formed in the passivation film 180 so as to partially uncover the branch wiring 160 is defined as a second contact hole 200.

As illustrated in FIG. 12, the main wirings 150 and the branch wirings 160 intersect in the wiring region, whereas they do not intersect in the connection part as illustrated in FIG. 13.

The main wiring 150 and the branch wiring 160 are electrically connected via an electrode 140 formed of the same layer as the pixel electrode being formed in the first contact hole 190 and the second contact hole 200.

Patent Literature 1 further teaches that it is preferable to reduce the line width of the branch wiring 160 which intersects the main wiring 150, in order to decrease capacitance of the main wiring 150.

CITATION LIST

Patent Literature 1

Japanese translation of PCT international application, Tokuhyou No. 2005-527856 A (Publication Date: Sep. 15, 2005)

SUMMARY OF INVENTION

Technical Problem

However, a configuration as with the case of Patent Literature 1 in which main wirings 150 are formed of the same layer as gate patterns and branch wirings 160 are formed of the same layer as data patterns has a problem that a display failure is likely to occur due to a disconnection failure or an abnormal line width. The reasons for the problem will be described below.

As illustrated in FIG. 12, the line width of the branch wiring 160 is generally narrower than that of the main wiring 150, and, in a case in which the pixel transistor in the not-illustrated display region is a bottom-gate type transistor, a layer forming the main wirings 150 is arranged lower than a layer forming the branch wirings 160.

In such a case, the following phenomenon are likely to occur in an intersection of the branch wiring 160 and the main wiring 150, that is to say, a place where the branch wiring 160 runs over the main wiring 150.

Because tapered parts (end portions) of the main wiring 150 that is a lower layer is uneven, when the branch wiring 160 is etched, the branch wiring 160 is likely to be disconnected by etchant flowing into a location above the tapered parts where the branch wiring 160 is formed.

In a photolithography process for producing the branch wirings 160, if the main wiring 150 formed of the lower layer is made of aluminum or the like, the main wiring 150 would reflect light and a film thickness of a resist would be uneven on a uprising caused by the main wiring 150. This leads to poor patterning accuracy of resists in the place where the branch wiring 160 runs over the main wiring 150.

In other words, the line width of the branch wiring 160 is easily varied. Unevenness in line width of the branch wiring 160 significantly affects the branch wiring 160 configured to have a narrow line width, thereby leading to a worsening of display quality.

In order to solve the problems, it is envisaged that the main wirings 150 with a broad line width are formed of the same layer as data patterns and the branch wirings 160 with a narrow line width are formed of the same layer as gate patterns.

However, if a liquid crystal display device is produced with the structure of the connection part of Patent Literature 1 as illustrated in FIG. 13, in which the main wiring 150 and the branch wiring 160 are connected via the electrode 140 formed of the same layer as the pixel electrodes formed in the two contact holes 190 and 200, a space between the main wirings 150 could not be reduced for the reason which will be explained below and thus a large area of the gate driving circuit region would be needed, thereby a picture frame area on the substrate for the liquid crystal display device becoming enlarged.

FIG. 14 illustrates a gate driving circuit to which the structure of the connection part of Patent Literature 1 is applied, wherein the main wirings 150 are formed of the same layer as data patterns and the branch wirings 160 are formed of the same layer as gate patterns.

Focusing on the connection part of the main wiring 150 to the branch wiring 160, it is found that a layer forming the branch wiring 160 is arranged lower than a layer forming the main wiring 150.

In the connection part as illustrated in FIG. 14, the first contact hole 190 is formed so as to partially uncover the main wiring 150 and the second contact hole 200 is formed so as to partially uncover the branch wiring 160, so that the main wiring 150 is connected to the branch wiring 160 via the electrode 140 formed of the same layer as the pixel electrodes formed in the first and second contact holes 190 and 200.

With such a configuration, the electrode 140 formed of the same layer as the pixel electrodes has to be arranged above the passivation film 180 in which the first and second contact holes 190 and 200 are formed, so that the second contact hole 200 is arranged in a space W between the main wirings 150.

In other words, if, for example, the second contact hole 200 is arranged below the main wiring 150, it would be difficult to form in the second contact hole 200 the electrode 140 of the same layer as the pixel electrodes, and to connect the main wiring 150 to the branch wiring 160 using the structure of the connection part of Patent Literature 1.

Consequently, in the above-described configuration in which the second contact hole 200 is arranged in a space W between the main wirings 150, the existence of the second contact hole 200 makes it difficult to narrow the space W between the main wirings 150.

The present invention has been accomplished in view of the above-mentioned problems and one object of the present invention is to provide an active matrix substrate in which a disconnection failure or an abnormal line width is reduced without enlarging the dimension of a driving circuit region.

Another object of the present invention is to provide a reliable active matrix display device having excellent display quality.

Solution to Problem

In order to attain any of the objects, an active matrix substrate according to the present invention is an active matrix substrate including: an insulating substrate; TFT elements formed on the insulating substrate; a display region where pixel electrodes electrically connected to the TFT elements respectively are arranged in a matrix; and a peripheral region where a driving circuit for driving the TFT elements is disposed, the peripheral region representing a periphery of the display region and including a plurality of branch wirings electrically connected to the driving circuit and a stem wiring to which one of the branch wirings is electrically connected, each of the TFT elements including a plurality of electrode layers, the branch wirings and the stem wiring being formed of the same layers as the plurality of electrode layers, the branch wirings being formed of an electrode layer arranged lower than an electrode layer forming the stem wiring, of the plurality of electrode layers that the each TFT element includes, an insulating layer being disposed between the stem wiring and the branch wirings, the stem wiring intersecting with another of the branch wirings, in the intersection, the stem wiring having a line width that is broader than that of the branch wiring, in a region where the stem wiring is electrically connected to the one of the branch wirings, the stem wiring overlapping with the one of the branch wirings, when seen in a plan view, a contact hole being formed in the insulating layer so as to uncover the one of the branch wirings, and the stem wiring and the one of the branch wirings being electrically connected with each other via a connecting conductor formed in the contact hole.

According to the above configuration, the stem wiring having a broad line width is formed above the branch wirings having a narrow line width.

That is, the branch wirings are formed of the electrode layer that is a lower layer than the electrode layer forming the stem wiring, of the plurality of electrode layers that the TFT element includes.

Consequently, with the configuration such that the stem wiring having a broad line width runs over uprisings created by the branch wirings having a narrow line width, a disconnection failure is not likely to occur, and thereby the yield can be improved.

Further, in a photolithography process for producing the stem wiring, the branch wirings arranged below the stem wiring have a narrow line width, so that the narrow line width of the branch wirings can prevent light from reflecting and suppress unevenness in thickness of resist films on the uprisings, thereby improving patterning accuracy.

With the above configuration, it becomes possible to reduce the influence of the unevenness in the line width of the stem wiring, which unevenness would occur when, under the influence of the branch wiring arranged below the stem wiring, the width of the stem wiring produced by a photolithography process whose patterning accuracy is inferior to that of a photolithography process for producing the branch wiring is broader than the width of the branch wiring.

According to the above configuration, in the region where the stem wiring is electrically connected to the branch wiring, the stem wiring overlaps with the branch wiring, with the insulating layer interposed, when seen in a plan view. The contact hole is formed in the insulating layer so as to uncover the branch wiring, the branch wiring being electrically connected to the stem wiring via a connecting conductor formed in the contact hole.

According to the configuration, an active matrix substrate can be attained, in which the space between the stem wirings is reduced relative to the above-mentioned conventional configuration (see FIG. 14) and thereby the peripheral region where the driving circuit is formed is downsized.

An active matrix display device according to the present invention is an active matrix display device including the active matrix substrate, in order to attain any of the objects.

According to the configuration, the provision of the active matrix substrate enables to attain a reliable active matrix display device having excellent display quality.

Advantageous Effects of Invention

As described above, an active matrix substrate of the present invention has a feature in which the peripheral region representing a periphery of the display region and including a plurality of branch wirings electrically connected to the driving circuit and a stem wiring to which one of the branch wirings is electrically connected, each of the TFT elements including a plurality of electrode layers, the branch wirings and the stem wiring being formed of the same layers as the plurality of electrode layers, the branch wirings being formed of an electrode layer arranged lower than an electrode layer forming the stem wiring, of the plurality of electrode layers that the each TFT element includes, an insulating layer being disposed between the stem wiring and the branch wirings, the stem wiring intersecting with another of the branch wirings, in the intersection, the stem wiring having a line width that is broader than that of the branch wiring, in a region where the stem wiring is electrically connected to the one of the branch wirings, the stem wiring overlapping with the one of the branch wirings, when seen in a plan view, a contact hole being formed in the insulating layer so as to uncover the one of the branch wirings, and the stem wiring and the one of the branch wirings being electrically connected with each other via a connecting conductor formed in the contact hole.

Therefore, the configuration has an effect to enable to attain an active matrix substrate in which a disconnection failure or an abnormal line width is reduced without enlarging the dimension of the driving circuit region. The configuration has an additional effect to enable to attain a reliable active matrix display device having excellent display quality.

BRIEF DESCRIPTION OF DRAWINGS

FIG. 1 is a partial enlarged view illustrating a region on a TFT array substrate according to one embodiment of the present invention, where signal wirings for a gate driving circuit are formed.

FIG. 13 is a cross-sectional view taken along the line C-C' of FIG. 12, illustrating a connection part of a stem wiring to a branch wiring.

DESCRIPTION OF EMBODIMENTS

Embodiments of the present invention will be described below with reference to the attached drawings. Here, sizes, materials, shapes and relative locations of the components described in the embodiments are merely examples and it should not be interpreted that the scope of the invention is limited thereto.

Embodiment 1

A configuration of a TFT array substrate 1 will be described below with reference to FIGS. 1 to 7. The TFT array substrate 1 is an active matrix substrate included in a liquid crystal display device as an example of an active matrix display device of the present invention.

Figure 4:
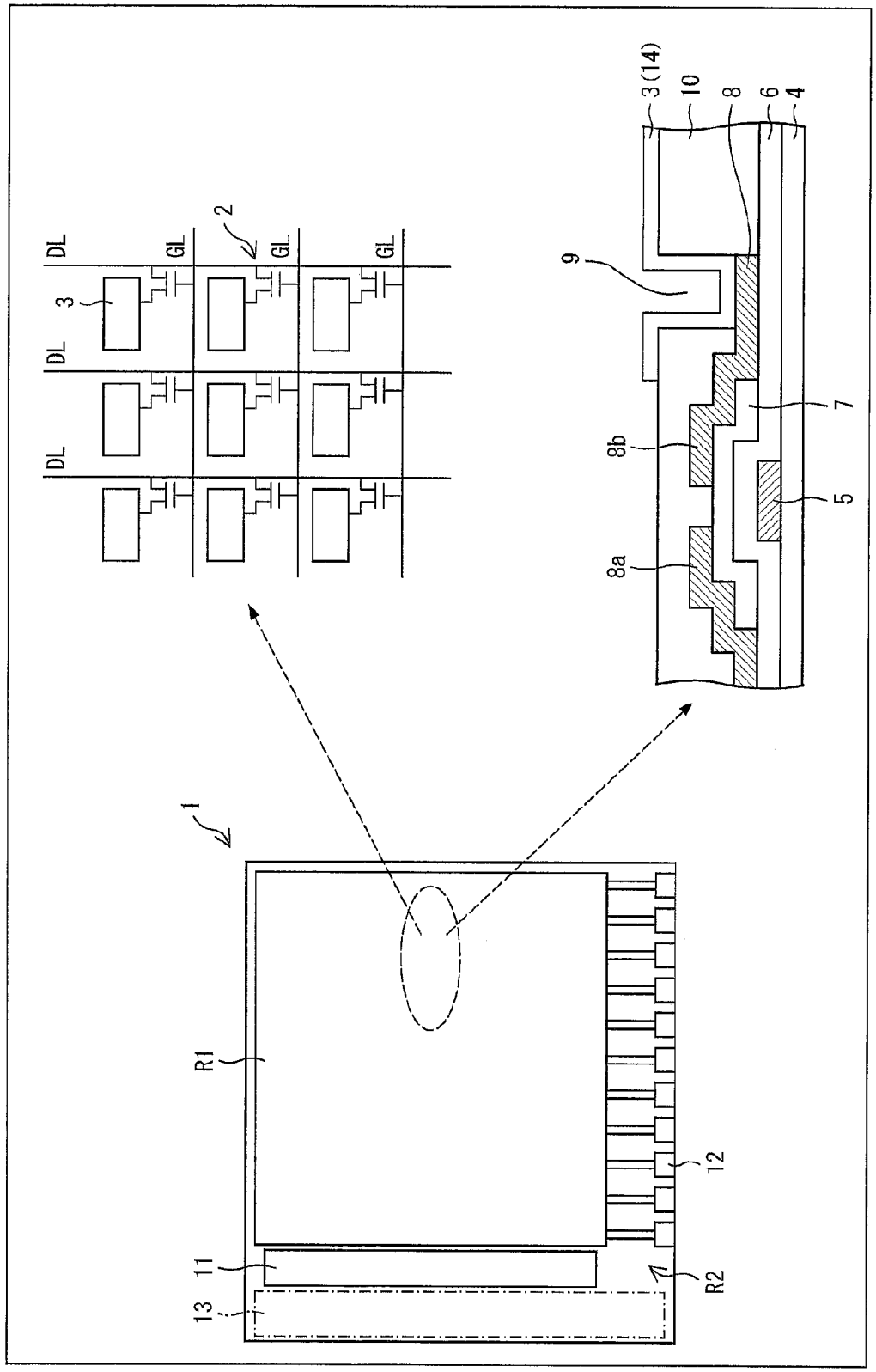
FIG. 4 illustrates a schematic configuration of the TFT array substrate.

FIG. 4 illustrates a schematic configuration of the TFT array substrate 1.

As illustrated in FIG. 4, the TFT array substrate 1 includes a display region R1 and a peripheral region R2 located in a periphery of the display region R1.

In the display region R1, pixel TFT elements 2 and pixel electrodes 3 are arranged in a matrix, each of the pixel electrodes 3 being connected to one of the pixel TFT elements 2.

As illustrated in FIG. 4, each pixel TFT element 2 has a structure in which, on an insulating substrate 4, a gate bus line GL and gate electrode layer 5, a gate insulating film 6, an amorphous silicon film 7 as a semiconductor film, a source/drain electrode layer 8 forming a source electrode 8a, a drain electrode 8b and data bus line DL, an insulating layer 10 in which a contact hole 9 is formed, and a pixel electrode 3 formed in such a manner that it is connected to the drain electrode 8b via the contact hole 9, are stacked in this order.

That is, the pixel TFT element 2 is a bottom-gate type element in the present embodiment. However, the pixel TFT element 2 is not limited thereto and may of course be another type element, such as a top-gate type element.

In the peripheral region R2, a gate driving circuit 11 and second terminal sections 12 connected to one or more external source driving circuits (not illustrated) are provided. The second terminal sections 12 will be described later.

The gate driving circuit 11 is connected to the gate bus lines GL and the one or more source driving circuits are connected to data bus lines DL via the second terminal sections 12 so as to control the pixel TFT elements 2 in accordance with external signals.

In FIG. 4, on the left side of a region of the peripheral region R2, where the gate driving circuit 11 is formed, signal wirings 13 for the gate driving circuit are provided, which include stem wirings such as clock signal wirings or supply voltage wirings, and branch wirings that connect the stem wirings to the gate driving circuit 11.

In the way as described above, in the peripheral region R2 of the TFT array substrate 1, the gate driving circuit 11, the second terminal sections 12, and the signal wirings 13 for the gate driving circuit are monolithically formed.

FIG. 1 is a partial enlarged view illustrating a region on the TFT array substrate 1, where the signal wirings 13 for the gate driving circuit are formed.

As illustrated in FIG. 1, the signal wirings 13 for the gate driving circuit include the stem wirings 13a and the branch wirings 13b that connect the stem wirings 13a to the gate driving circuit 11.

The gate driving circuit 11 is configured to include a plurality of stages (not illustrated), each of which is connected to a plurality of the branch wirings 13b, each of which is connected to a stem wiring 13a.

By way of example, FIG. 1 illustrates a configuration in which each of the stage constituting the gate driving circuit 11 is connected to four branch wirings 13b, each of which is connected to different one of four stem wirings 13a.

According to the present embodiment, since the pixel TFT element 2 illustrated in FIG. 4 is a bottom-gate type element in which the gate electrode layer 5 is a lower layer than the source/drain electrode layer 8, the stem wirings 13a are formed of the source/drain electrode layer 8 and the branch wirings 13b are formed of the gate electrode layer 5.

On the other hand, in a case in which the pixel TFT element 2 is, for example, a top-gate type element, the stem wirings 13a are formed of the gate electrode layer 5 and the branch wirings 13b are formed of the source/drain electrode layer 8.

That is, as described above, the branch wirings 13b should be formed of an electrode layer arranged lower than an electrode layer forming the stem wirings 13a, of the electrode layers that the pixel TFT element 2 includes.

The description on all embodiments below will be made, assuming that the stem wirings 13a are formed of the source/drain electrode layer 8 and the branch wirings 13b are formed of the gate electrode layer 5.

Because the branch wiring 13b with a narrow line width is preferred in view of load reduction, and the number of the branch wirings 13b tends to increase in order to realize a high-resolution display image, the branch wiring 13b is formed with a narrower line width than that of the stem wiring 13a.

In particular, if long edges of the pixel electrodes each of which corresponds to each of primary colors of a color display image are arranged in a direction extending along with the gate bus lines and a technology for reducing the number of source driving circuits is adopted, the number of the branch wirings 13b would further be increased. In this case, the branch wiring 13b can be formed with a line width even narrower than that of the stem wiring 13a.

FIG. 2(a) is a cross-sectional view taken along the line A-A' of FIG. 1, illustrating the region where the stem wiring 13a is connected to the branch wiring 13b. FIG. 2(b) illustrates an example of another connection form.

As illustrated in FIGS. 1 and 2(a), in the region where the stem wiring 13a is connected to the branch wiring 13b, the stem wiring 13a overlaps with the branch wiring 13b, when seen in a plan view, wherein the gate insulating film 6 is disposed between the stem wiring 13a and the branch wiring 13b.

Figure 3:
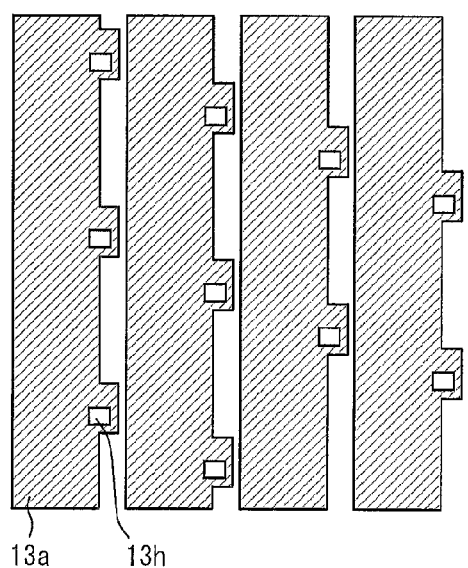
FIG. 3 illustrates a patterning geometry of the stem wirings formed on the TFT array substrate.

FIG. 3 illustrates a patterning geometry of the stem wirings 13a.

In the region where the stem wiring 13a is connected to the branch wiring 13b, as illustrated in FIGS. 2(a) and 3, a contact hole and a through hole 13h (the contact hole being a hole formed in the gate insulating film 6 and the through hole being a hole formed in the stem wiring 13a) are formed in the gate insulating film 6 and the stem wiring 13a, so as to uncover the branch wiring 13b that is a lower layer.

Although the contact hole and the through hole 13h are formed in a different shape according to the present embodiment, they may be formed in the same shape.

Further, as illustrated in FIG. 2(a), the insulating layer 10 is formed so as to cover the stem wiring 13a, and, in the insulating layer 10, a second contact hole 13h' is formed in a manner such that it overlaps at least partially with the contact hole and the through hole 13h.

In a region where the contact hole and the through hole 13h, and the second contact hole 13h' are formed, a same layer as the pixel electrodes 3 is used as a connecting conductor 14 to connect the stem wiring 13a to the branch wiring 13b.

Although, in the present embodiment, a transparent conductor film such as an ITO (Indium Tin Oxide) or an IZO (Indium Zinc Oxide), which is generally used to produce the pixel electrodes 3, is used as the connecting conductor 14 so that the TFT array substrate 1 can be produced without an additional process for producing the connecting conductor 14, the connecting conductor 14 is not limited thereto and any conductive film may be used as long as it can connect the stem wiring 13a to the branch wiring 13b.

FIG. 2(b) illustrates an example of another connection form in the region where the stem wiring 13a is connected to the branch wiring 13b. In this connection form, although it is not illustrated in FIG. 2(b), the semiconductor film 7 may be formed in a manner such that the semiconductor film 7 arranged lower than the stem wiring 13a is extended from the stem wiring 13a (by the length of the extension of the gate insulating film 6 from the stem wiring 13a).

When the gate insulating film 6 is etched, the semiconductor film 7 which is extended from the stem wiring 13a operates as a barrier layer and protects the gate insulating film 6 that is a lower layer than the semiconductor film 7, so that the gate insulating film 6 can be formed in a step-like shape, as illustrated in FIG. 2(b).

According to the configuration, the step-like shape can reduce disconnection of the connecting conductor 14 (the pixel electrode 3).

Further, the semiconductor film 7 operating as the barrier layer is produced by a process for producing the semiconductor film that the pixel TFT element 2 includes, which therefore does not accompany an increase of the number of processes.

After the gate insulating film 6 is etched, as illustrated in FIG. 2(b), the semiconductor film 7 is remained in a region covered with the stem wiring 13a whereas, in a region which is not covered with the stem wiring 13a, the semiconductor film 7 is disappeared or otherwise be remained with a significantly thinned thickness (FIG. 2(b) shows the case in which the semiconductor film 7 is disappeared).

The stem wiring 13a can also be connected to the branch wiring 13b by an alternative method other than that mentioned above, the alternative method being such that the contact hole 13h is formed in the gate insulating film 6 so as to uncover the branch wiring 13b, the connecting conductor 14 is provided in the contact hole 13h in such a manner that the connecting conductor 14 is connected to the branch wiring 13b, and then the stem wiring 13a is provided in such a manner that it is connected to the connecting conductor 14.

Alternatively, the stem wiring 13a may directly be connected to the branch wiring 13b by means of the stem wiring 13a itself, which will be explained in detail later in Embodiment 3.

FIG. 1 illustrates a case in which the same layer as the pixel electrodes 3 is used as the connecting conductor 14.

In this case, the above-mentioned pixel TFT elements 2 including the pixel electrodes 3, and the signal wirings 13 for the gate driving circuit can simultaneously be formed on the TFT array substrate 1 by a five mask production process using five photo masks including: a photo mask for forming the gate bus line GL and gate electrode layer 5; a photo mask for forming the amorphous silicon film 7; a photo mask for forming the data bus line DL and source/drain electrode layer 8; a photo mask for forming the insulation layer 10; and a photo mask for forming the pixel electrode 3.

The method for forming the signal wirings 13 for the gate driving circuit is described further in detail below.

The photo mask for forming the amorphous silicon film 7 is defined as a halftone mask capable of controlling light exposure, and the photo mask for forming the amorphous silicon film 7 and the photo mask for forming the data bus line DL and source/drain electrode layer 8 are respectively provided with patterns which correspond to the contact holes 13h formed in the gate insulating film 6 and the stem wiring 13a.

The halftone mask is used so that no resist film is formed on a portion in the gate insulating film 6, where the contact hole 13h is to be formed, and a resist film is formed thickly on a region where the gate insulating film 6 and the amorphous silicon film 7 should be remained, and a resist film is formed thinly on a region where only the amorphous silicon film 7 should be removed and the gate insulating film 6 should be remained. Then, an etching process is performed using the above-mentioned thick and thin resist films as masks. In this way, the signal wirings 13 for the gate driving circuit can be produced by this five mask production process.

The signal wirings 13 for the gate driving circuit can also be produced by a four mask production method using four masks including the above-described halftone mask and a photo mask in which the photo mask for forming the amorphous silicon film 7 and the photo mask for forming the data bus line DL and source/drain electrode layer 8 are incorporated.

Although the amorphous silicon film 7 is used as a semiconductor film in the present embodiment, the semiconductor film is not limited thereto and an amorphous germanium, an amorphous silicon germanium, or an amorphous silicon carbide may be used as the semiconductor film.

Further, polycrystalline silicon, polycrystalline germanium, polycrystalline silicon germanium, or polycrystalline silicon carbide may be used as the semiconductor film.

Although, in the present embodiment, the stem wiring 13a, that is, the source/drain electrode layer 8 is made of Al alloy, Mo, or laminated layers of Al alloy and Mo, the stem wiring 13a is not limited thereto and may be formed in laminated layers including, as appropriate, an element selected from a group of Ta, W, Ti, Mo, Al, Cu, Cr, Nd and the like, or an alloy material or compound material consisted mainly of the element.

And, although the branch wiring 13b, that is, the gate electrode layer 5 is made of Al alloy, for example, the branch wiring 13b is not limited thereto and may be made of an element selected from a group of Ta, W, Ti, Mo, Al, Cu, Cr, Nd and the like, or an alloy material or compound material consisted mainly of the element. The branch wiring 13b may also be made of a semiconductor film, in particular, polycrystalline silicon, doped with an impurity such as phosphorus or boron.

Further, if patterns are made in the branch wiring 13b of a single layered Al alloy film, edges of the branch wiring 13b are likely to rise perpendicularly. The wiring having such a shape may easily disconnect other wiring which runs over it.

As the gate insulating film 6, inorganic film such as SiNx or SiOx may be used, however, the gate insulating film 6 is not limited thereto.

The insulation layer 10 may be made of, for example, an inorganic film such as SiNx having a thickness of approximately 0.2 μm to 0.8 μm, however, the insulation layer 10 is not limited thereto and may be made of an inorganic film such as SiOx or SiON. The insulation layer 10 may also be made of, in addition to the inorganic film, an organic film such as a photosensitive transparent acrylic resin having a thickness of approximately 1 μm to 4 μm. Further, the insulation layer 10 may have a laminated structure of an inorganic film and an organic film.

Figure 2:
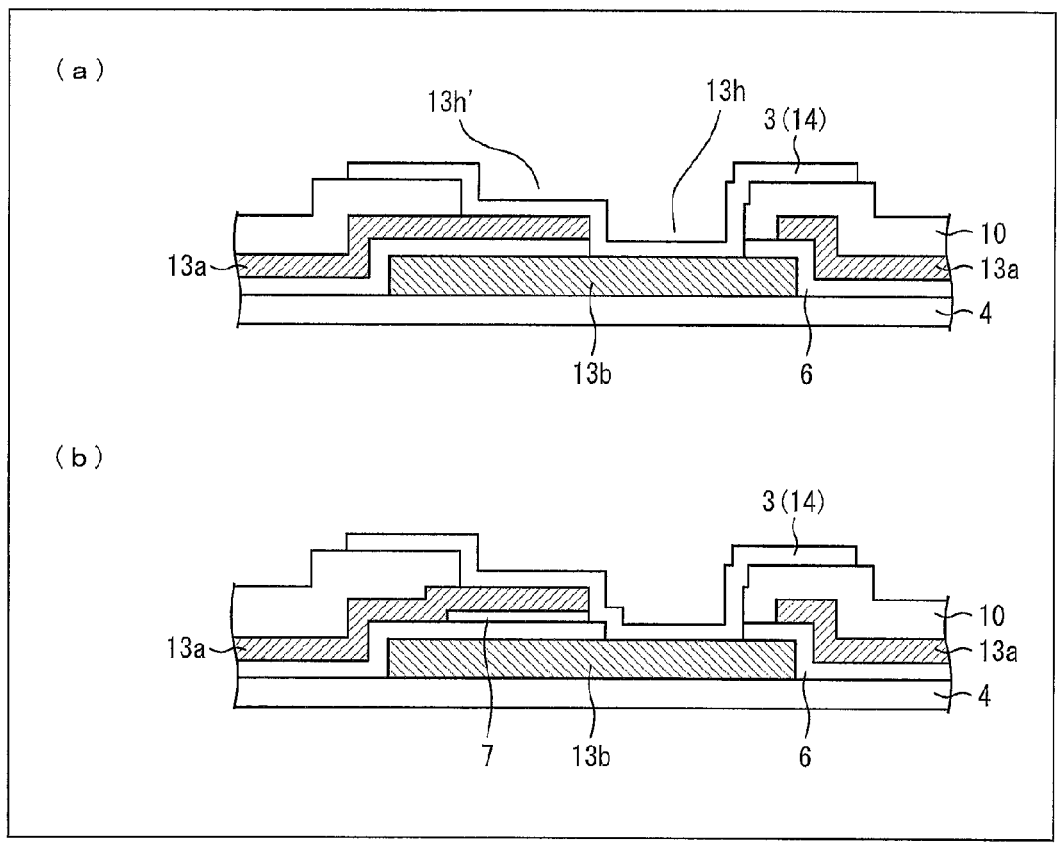
FIG. 2(a) is a cross-sectional view taken along the line A-A' in the region of FIG. 1 where the signal wirings for the gate driving circuit are formed, illustrating a region where a stem wiring is connected to branch wiring.
FIG. 2(b) is a cross-sectional view illustrating an example of another configuration of the region.

According to the configuration, as illustrated in FIGS. 1 and 2, the stem wiring 13a having a broad line width is formed above the branch wirings 13b having a narrow width in a manner such that the stem wiring 13a having a broad line width runs over the uprisings created by the branch wirings 13b having a narrow width, so that a disconnection failure is not likely to occur and the yield can be improved.

Further, in a photolithography process for producing the stem wiring 13a, the branch wirings 13b arranged below the stem wiring 13a have a narrow line width, so that the narrow line width of the branch wirings 13b can prevent light from reflecting and unevenness in thickness of resist films generated on the uprisings, thereby improving patterning accuracy.

Furthermore, it becomes possible to reduce the influence of the unevenness in the line width of the stem wiring 13a, which unevenness would occur when, under the influence of the branch wiring 13b arranged below the stem wiring 13a, the width of the stem wiring 13a produced by a photolithography process whose patterning accuracy is inferior to that of a photolithography process for producing the branch wiring 13b is broader than the width of the branch wiring 13b.

In this regard, a detailed explanation will be made below with reference to an example. Assuming that the variation in the line width of the stem wiring 13a is, for example, ±1 μm, the stem wiring 13a being produced by a photolithography process whose patterning accuracy is inferior to a photolithography process for producing the branch wiring 13b, the line width (50 μm) of the stem wiring 13a is ten times as broad as the line width (5 μm) of the branch wiring 13b, and thereby the damage of the variation in the line width on the stem wiring 13a would be negligible.

According to the configuration, in a region where the stem wiring 13a is connected to the branch wiring 13b, the stem wiring 13a overlaps with the branch wiring 13b when seen in a plan view, with the gate insulating film 6 being interposed. The stem wiring 13a and the gate insulating film 6 are formed in such a manner that they uncover the branch wiring 13b, and the stem wiring 13a is connected to the branch wiring 13b via the connecting conductor 14.

Figure 14:
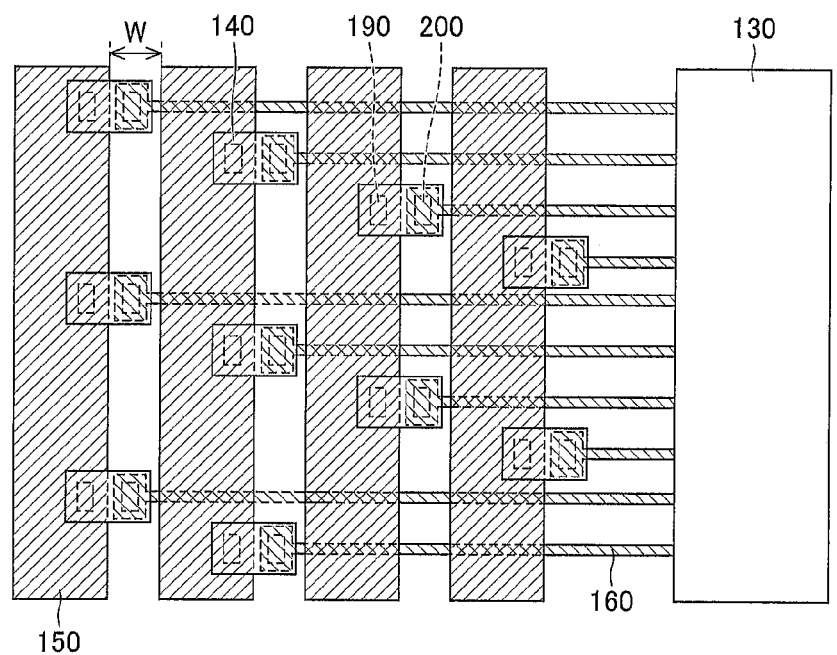
FIG. 14 is a plan view illustrating a gate driving circuit region in which the main wirings formed of the same layer as data patterns are connected to the branch wirings formed of the same layer as gate patterns via the structure of the connection part illustrated in FIG. 13.

Consequently, a space W1 between the stem wirings 13a of the configuration according to FIG. 1 can be reduced as compared with the space W between the main wirings 150 of the above-mentioned conventional configuration in which the main wiring 150 cannot overlap with the branch wiring 160 in the connection region, as illustrated in FIG. 14.

In other words, the present embodiment can reduce the space W1 between the stem wirings 13a and thereby avoid enlargement of the dimension of the peripheral region R2 where the signal wirings 13 for the gate driving circuit are formed.

(Modification 1)

Figure 5:
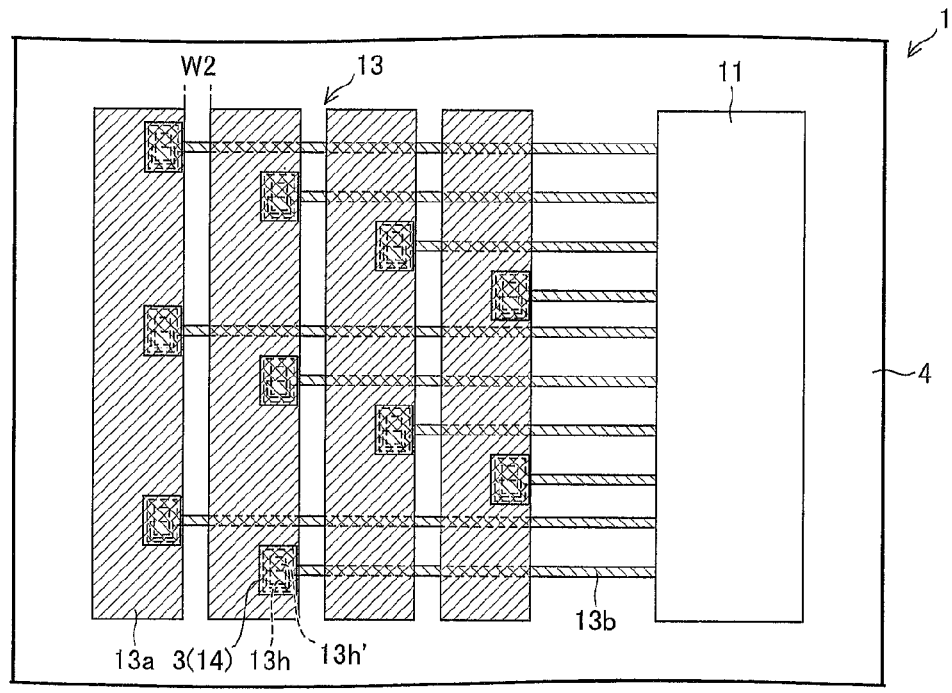
FIG. 5 illustrates a modification of patterning geometry of the stem wirings.

FIG. 5 illustrates a modification of patterning geometry of the stem wirings 13a.

As illustrated in FIG. 5, the stem wirings 13a preferably have a same width and are disposed linearly and parallel with a uniform space therebetween.

The region where the stem wiring 13a is connected to the branch wiring 13b is arranged in a lower layer than the stem wiring 13a.

According to the configuration, the space W2 between the stem wirings 13a can further be reduced, which allows to further reduce the need of the enlargement of the dimension of the peripheral region R2 where the signal wirings 13 for the gate driving circuit are formed.

If a sealing material of a type in which it is cured by an exposure to UV irradiated from the rear surface of the TFT array substrate 1 is provided on the region where the signal wirings 13 for the gate driving circuit are formed, the UV irradiation dose to be irradiated to the sealing material would substantially be uniform, because the plurality of stem wirings 13a have a same width and are disposed linearly and parallel with a uniform space act as slits.

Consequently, the sealing material can be cured uniformly and evenly according to the configuration, so that an occurrence of the reliability problem caused by the uncured components from the sealing material can be prevented.

(Modification 2)

Figure 6:
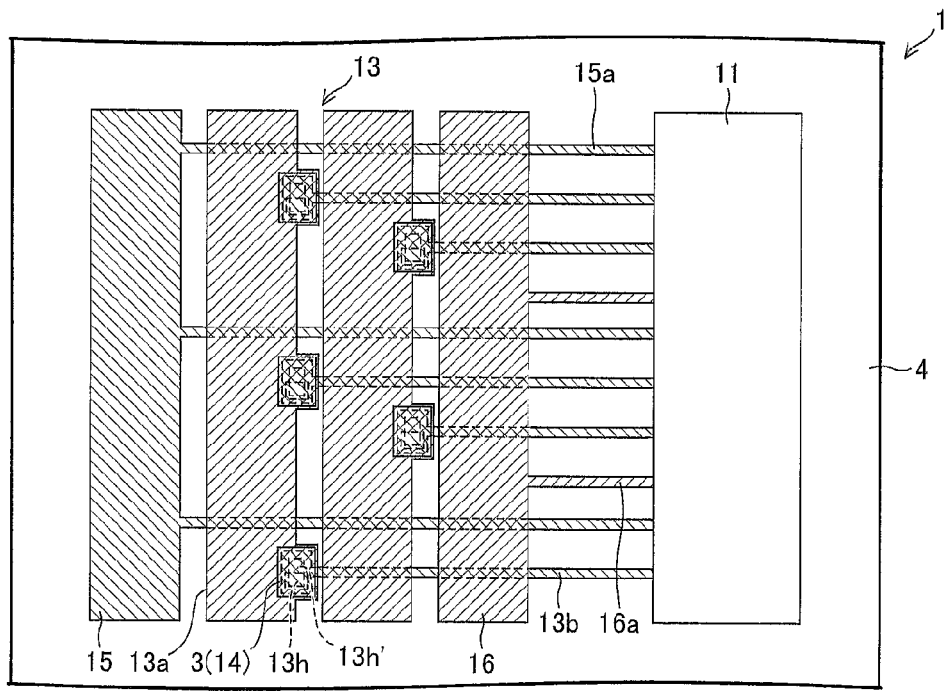
FIG. 6 illustrates another modification of the stem wirings and the branch wirings.

FIG. 6 illustrates another modification of the stem wirings 13a and the branch wirings 13b.

As illustrated in FIG. 6, a plurality of stem wirings 13a is provided. In a place located further from the gate driving circuit 11 than one of the plurality of stem wirings 13a, that is located furthest from the gate driving circuit 11, a second stem wiring 15 is provided. The second stem wiring 15 and second branch wirings 15a which connect the second stem wiring 15 to the gate driving circuit 11 are preferably formed of the same layer as the branch wirings 13b, the branch wirings 13b being formed of the same layer as the gate bus line GL and gate electrode layer 5.

The second stem wiring 15 and the second branch wirings 15a never intersect with the branch wirings 13b formed of the same layer as the gate electrode layer 5, due to their arrangements, so that they can be formed of the same layer as the branch wirings 13b formed of the same layer as the gate electrode layer 5.

According to the configuration, since both of the second stem wiring 15 and the second branch wirings 15a which connect the second stem wiring 15 to the gate driving circuit 11 are formed of the same layer as the branch wirings 13b, no additional contact hole is necessary for connecting the second stem wiring 15 to the second branch wirings 15a, which can improve the yield.

Further, the second stem wiring 15 and the second branch wirings 15a are formed by patterning the same layer, so that lowering of resistance can be achieved.

As illustrated in FIG. 6, in a place located nearer to the gate driving circuit 11 than the stem wiring 13a disposed the nearest to the gate driving circuit 11, of the plurality of stem wirings 13a, a third stem wiring 16 is provided. The third stem wiring 16 and third branch wirings 16a which connect the third stem wiring 16 to the gate driving circuit 11 are preferably formed of the same layer as the stem wirings 13a, the stem wirings 13a being formed of the same layer as the source/drain electrode layer 8.

According to the configuration, the third stem wiring 16 and the third branch wirings 16a never intersect with the stem wirings 13a formed of the same layer as the source/drain electrode layer 8, due to their arrangements, so that they can be formed of the same layer as the stem wirings 13a formed of the same layer as the source/drain electrode layer 8.

Since both of the third stem wiring 16 and the third branch wirings 16a are formed of the same layer as the stem wirings 13a, no additional contact hole is necessary for connecting the third stem wiring 16 to the third branch wirings 16a, which can improve the yield.

Further, since the third branch wirings 16a are formed of the same layer as the source/drain electrode layer 8, the connection of the third branch wirings 16a to a source or drain electrode of the transistor provided on the gate driving circuit 11 is made without a separate switching member.

(Modification 3)

Figure 7:
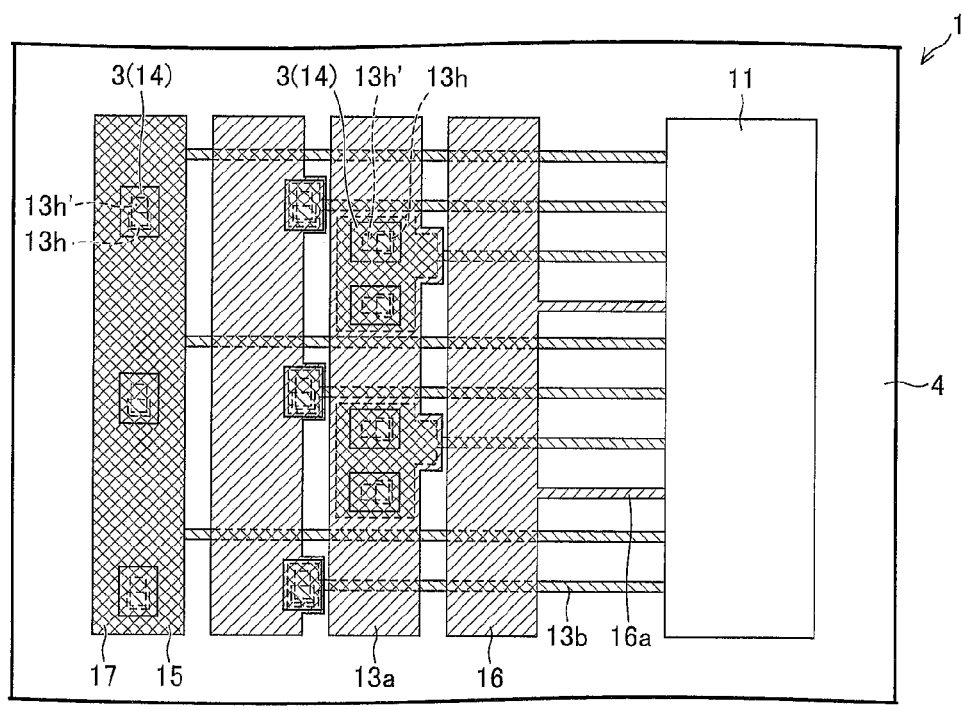
FIG. 7 illustrates yet another modification of the stem wirings formed with a multi-layer structure.

FIG. 7 illustrates yet another modification of the stem wirings 13a.

As illustrated in FIG. 7, a plurality of stem wirings 13a are provided, one of which is partially laminated with wirings formed of the same layer as the branch wirings 13b and of the same layer as the pixel electrodes 3, that is to say, the stem wiring 13a is formed in a multi-layer structure, the stem wiring 13a and the wirings being electrically connected.

As illustrated in FIG. 7, the shape of the branch wirings 13b arranged below the stem wirings 13a is greater than that in FIG. 1.

The same layer as the pixel electrodes 3 are used as a connecting conductor 14 to connect the stem wiring 13a to the branch wiring 13b, as illustrated in FIG. 2.

In FIG. 7, two connection points are formed on the branch wiring 13b arranged below the stem wiring 13a, and thus four connection points are totally provided on the single stem wiring 13a. However, the number of the connection points is not particularly limited as long as an effect of lowering of resistance can be achieved.

In other words, it is preferable that a plurality of stem wirings 13a are provided, one of which is partially laminated with one or more wirings formed of the same layer as branch wiring 13b and/or the same layer as pixel electrode 3, that is to say, the stem wiring 13a is formed in a multi-layer structure. The one or more wirings are electrically connected to the stem wiring 13a.

According to the configuration, because the stem wiring 13a partially has the multi-layer structure, the lowering of resistance can further be achieved.

Further, it is also preferable that the second stem wiring 15 is laminated with one or more wirings formed of the same layer as the stem wirings 13a, and/or the same layer as pixel electrodes 3, the stem wirings 13a being formed of the same layer as the source/drain electrode layer 8, that is to say, the second stem wiring 15 is formed in a multi-layer structure. The one or more wirings are electrically connected to the second stem wiring 15.

As illustrated in FIG. 7, on the second stem wiring 15, a layer 17 having substantially the same shape as that of the second stem wiring 15 is formed, the layer 17 being formed of the same layer as the stem wirings 13a and including the contact holes 13h.

As illustrated in FIG. 2, the same layer as the pixel electrodes 3 is used as a connecting conductor 14, to connect the second stem wirings 15 to the layer 17.

Further, in FIG. 7, three connection points are provided on a second stem wiring 15. However, as long as an effect of lowering of resistance can be achieved, a connection point may respectively be provided on an input terminal and an end terminal, that is, two connection points may totally be provided, and thus the number of the connection points is not particularly limited.

According to the configuration, since the second stem wiring 15 has the multi-layer structure, additional lowering of resistance can be achieved.

Embodiment 2

Now, Embodiment 2 of the present invention is described with reference to FIG. 8. The present embodiment differs from Embodiment 1 in that the stem wirings 13a, the second stem wiring 15 and the third stem wiring 16 are provided with terminal sections 18 connected respectively thereto, but otherwise the configuration of Embodiment 2 is equivalent to that of Embodiment 1 described above. For ease of the description, the same reference numbers are used for the member of the present embodiment having the same functions as those of the member indicated in the figures illustrating Embodiment 1 and the description thereof will be omitted.

The terminal sections 18 respectively connected to the stem wirings 13a, the second stem wiring 15 and the third stem wiring 16 are preferably formed of the same material, the terminal sections 18 being to externally input signals.

Figure 8:
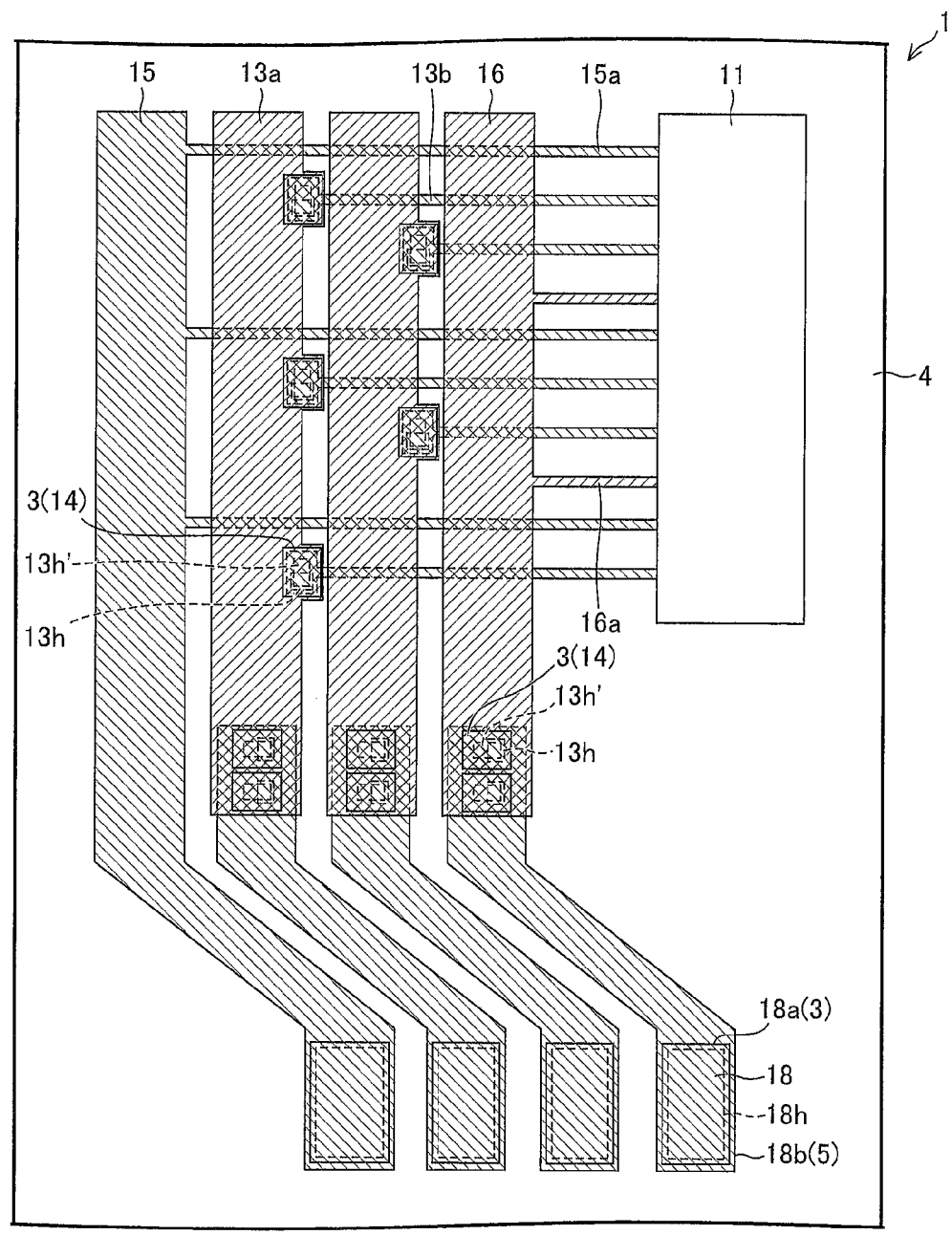
FIG. 8 is a partial enlarged view illustrating a region on a TFT array substrate according to another embodiment of the present invention, where signal wirings for a gate driving circuit are formed.

FIG. 8 illustrates an example in which all of the terminal sections 18 are formed of the same layer as the branch wirings 13b which are formed of the same layer as the gate electrode layer 5.

As illustrated in FIG. 8, the second stem wiring 15 is formed of the same layer as the branch wirings 13b which are formed of the same layer as the gate electrode layer 5, and thus the terminal sections 18, one of which is connected to the second stem wiring 15, are also formed of the same layer as the branch wirings 13b.

On the other hand, the stem wirings 13a and the third stem wiring 16 are formed of the same layer as the source/drain electrode layer 8. Accordingly, it is necessary to provide structures for electrically connecting the stem wirings 13a and the third stem wiring 16 to the terminal sections 18 formed of the same layer as the gate electrode layer 5.

In the present embodiment, the same layer as the pixel electrodes 3 is used as a connecting conductor 14, as illustrated in FIG. 2, to connect the stem wirings 13a and the third stem wiring 16 to wirings extending from the terminal sections 18.

For the connection of the terminal sections 18 to an external circuit for inputting signals to the terminal sections 18, conductive particles of approximately 3 μm to 5 μm, or the like are generally used. However, if the each terminal section 18 has a different film structure, a problem may be caused that film thicknesses are varied and a contact deterioration is likely to occur.

In a case in which an indentation test is performed for the conductive particles as a contact test, for example, each of the terminal section 18 having a different film thickness would cause another problem that criterions for evaluation are complicated.

According to the configuration, all of the terminal sections 18 are formed of the same layer and the same material, so that the above-mentioned problems do not occur.

Although, in FIG. 8, all of the terminal sections 18 are formed of the same layer as the gate electrode layer 5, they may of course be formed of the same layer as the source/drain electrode layer 8.

Further, it is preferable that the terminal section 18 includes an upper electrode 18a and a lower electrode 18b, wherein the lower electrode 18b is formed of the same layer as the gate electrode layer 5, and the upper electrode 18a is formed of the same layer as the source/drain electrode layer 8 or the same layer as the pixel electrodes 3. The upper electrode 18a and the lower electrode 18b are electrically connected.

In FIG. 8, the lower electrode 18b is formed of the same layer as the gate electrode layer 5, the upper electrode 18a is formed of the same layer as the pixel electrodes 3, and the upper electrode 18a and the lower electrode 18b are electrically connected via a contact hole 18h.

According to the configuration, since the upper electrode 18a of the terminal section 18 is formed of the same layer as the pixel electrodes 3 and the lower electrode 18b of the terminal section 18 is formed of the same layer as the gate electrode layer 5, no additional process is required to produce the terminal section 18.

Furthermore, the terminal sections 18 and second terminal sections 12 as illustrated, for example, in FIG. 4 for externally inputting other signals are preferably made of the same material.

In the present embodiment, the upper electrode 18a of the terminal section 18 and an upper electrode of the second terminal section 12 are formed of the same layer as the pixel electrodes 3, and the lower electrode 18b of the terminal section 18 and a lower electrode of the second terminal section 12 are formed of the same layer as the gate electrode layer 5.

According to the configuration, since all of the terminal sections 12, 18 provided on the TFT array substrate 1 are made of the same material, the above-mentioned problems of the occurrence of a contact failure and the complicated criterions for evaluation in an indentation test performed for the conductive particles do not occur.

Embodiment 3

Now, Embodiment 3 of the present invention is described with reference to FIGS. 9 and 10. The present embodiment differs from Embodiment 1 in that the uncovered branch wiring 13b and the stem wiring 13a are directly connected, but otherwise the configuration of Embodiment 3 is equivalent to that of Embodiment 1 described above. For ease of the description, the same reference numbers are used for the members of the present embodiment having the same functions as those of the members indicated in the figures illustrating Embodiment 1 and the description thereof will be omitted.

Figure 9:
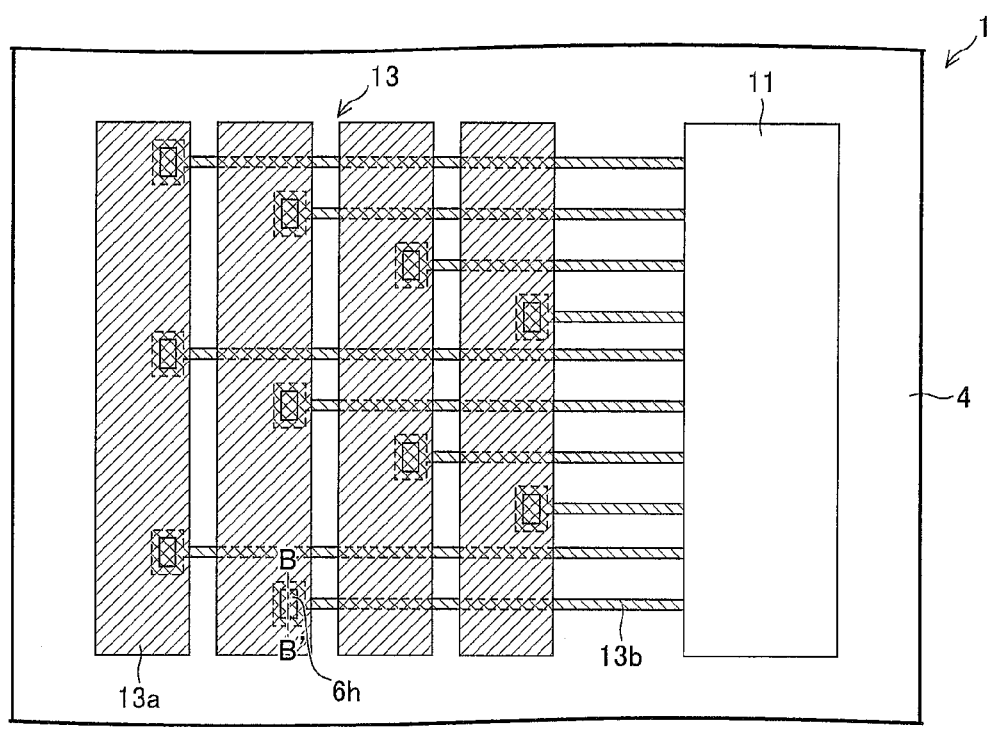
FIG. 9 is a partial enlarged view illustrating a region on a TFT array substrate according to yet another embodiment of the present invention, where signal wirings for a gate driving circuit are formed.

FIG. 9 illustrates other signal wirings 13 for the gate driving circuit, which are provided on the TFT array substrate 1.

Figure 10:
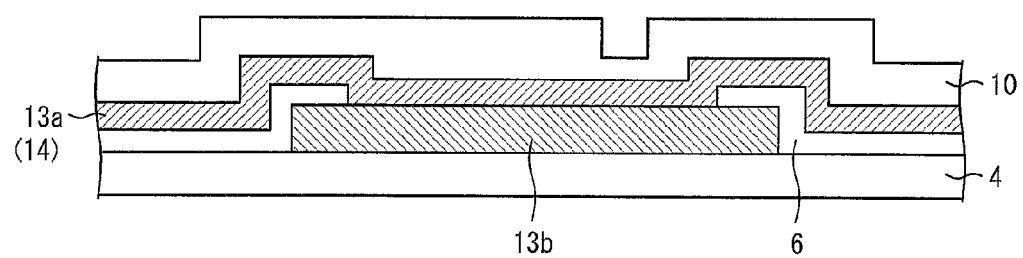
FIG. 10 is a cross-sectional view taken along the line B-B' in the region of FIG. 9 where the signal wirings for the gate driving circuit are formed, illustrating a region where a stem wiring is connected to a branch wiring.

FIG. 10 is a cross-sectional view taken along the line B-B' of FIG. 9, illustrating a connection part of the stem wiring 13a to the branch wiring 13b.

As illustrated in FIGS. 9 and 10, the stem wirings 13a are formed of the same layer as a source/drain electrode layer 8, and the branch wirings 13b connected to a gate driving circuit 11 are formed of the same layer as a gate electrode layer 5.

Further, a gate insulating film 6 is provided between the stem wiring 13a and the branch wiring 13b, and the stem wiring 13a overlaps with the branch wiring 13b, when seen in a plan view. In a region where the stem wiring 13a is connected to the branch wiring 13b, a contact hole 6h is formed in the gate insulating film 6 so as to uncover the branch wiring 13b.

As illustrated in FIGS. 9 and 10, the uncovered branch wiring 13b is directly connected to the stem wiring 13a by means of the stem wiring 13a that is formed in the contact hole 6h.

According to the configuration, in the connection part, the stem wiring 13a is connected to the branch wiring 13b by means of the stem wiring 13a.

In other words, the stem wiring 13a itself is used as a connecting conductor 14, so that no additional process is required to produce the connecting conductor 14.

Consequently, the signal wirings 13 for the gate driving circuit can be produced by a five mask production method, in which the above-mentioned photo mask for forming the amorphous silicon film 7 is defined as a halftone mask capable of controlling light exposure, and the resist films having different thicknesses are provided onto the amorphous silicon film 7.

Further, according to the configuration, the same layer as the pixel electrodes 3 is not disposed in a portion of the peripheral region of the TFT array substrate 1, where the signal wirings 13 for the gate driving circuit are formed.

Accordingly, even if a sealing material for combining the TFT array substrate 1 to a counter substrate (not illustrated) is provided in the portion where the signal wirings 13 for the gate driving circuit are formed, a secondary contact failure caused by a seal spacer (such as a rod-shaped glass fiber with a diameter of a few microns) in the sealing material can be prevented.

Further, even if the sealing material includes a conductive material (such as beads coated with gold or silver) for supplying signals from the TFT array substrate 1 to the counter substrate, a leakage failure can be prevented.

If patterns are made in the branch wirings 13b of a single layered Al alloy film as exemplified as the gate electrode layer 5, edges of the branch wirings 13b are likely to rise perpendicularly. The wiring having such a shape may easily disconnect other wiring which runs over it.

Consequently, the configuration illustrated in FIG. 9 in which the widely formed stem wirings 13a runs over the branch wirings having the above-described shape is advantageous, in view of the yield improvement.

Embodiment 4

Now, Embodiment 4 of the present invention is described with reference to FIG. 11. For ease of the description, the same reference numbers are used for the members of the present embodiment having the same functions as those of the members indicated in the figures illustrating Embodiments 1 to 3 and the description thereof will be omitted.

Figure 11:
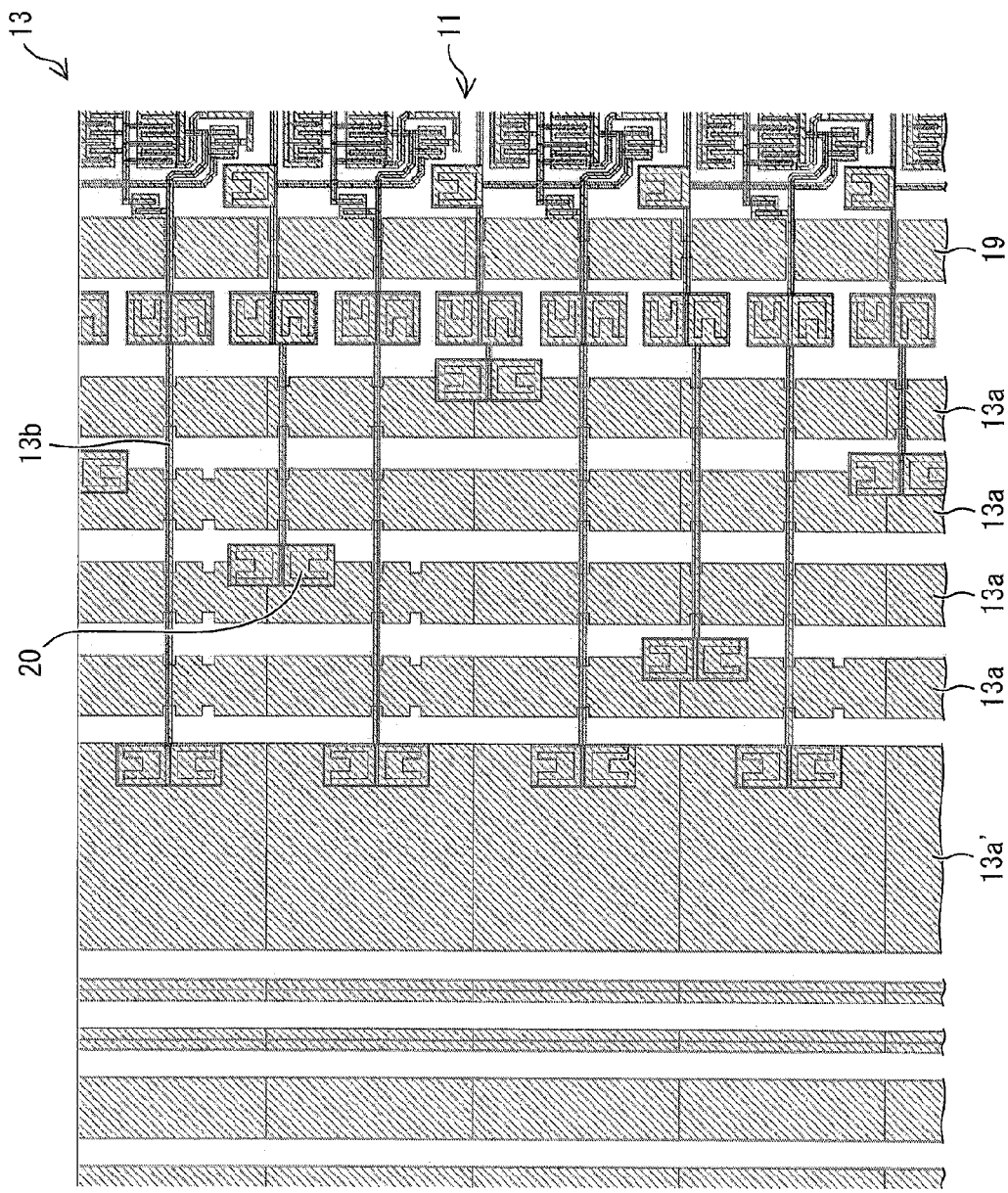
FIG. 11 is an enlarged view illustrating another region on a TFT array substrate according to yet another embodiment of the present invention, where signal wirings for a gate driving circuit are formed.
Figure 12:
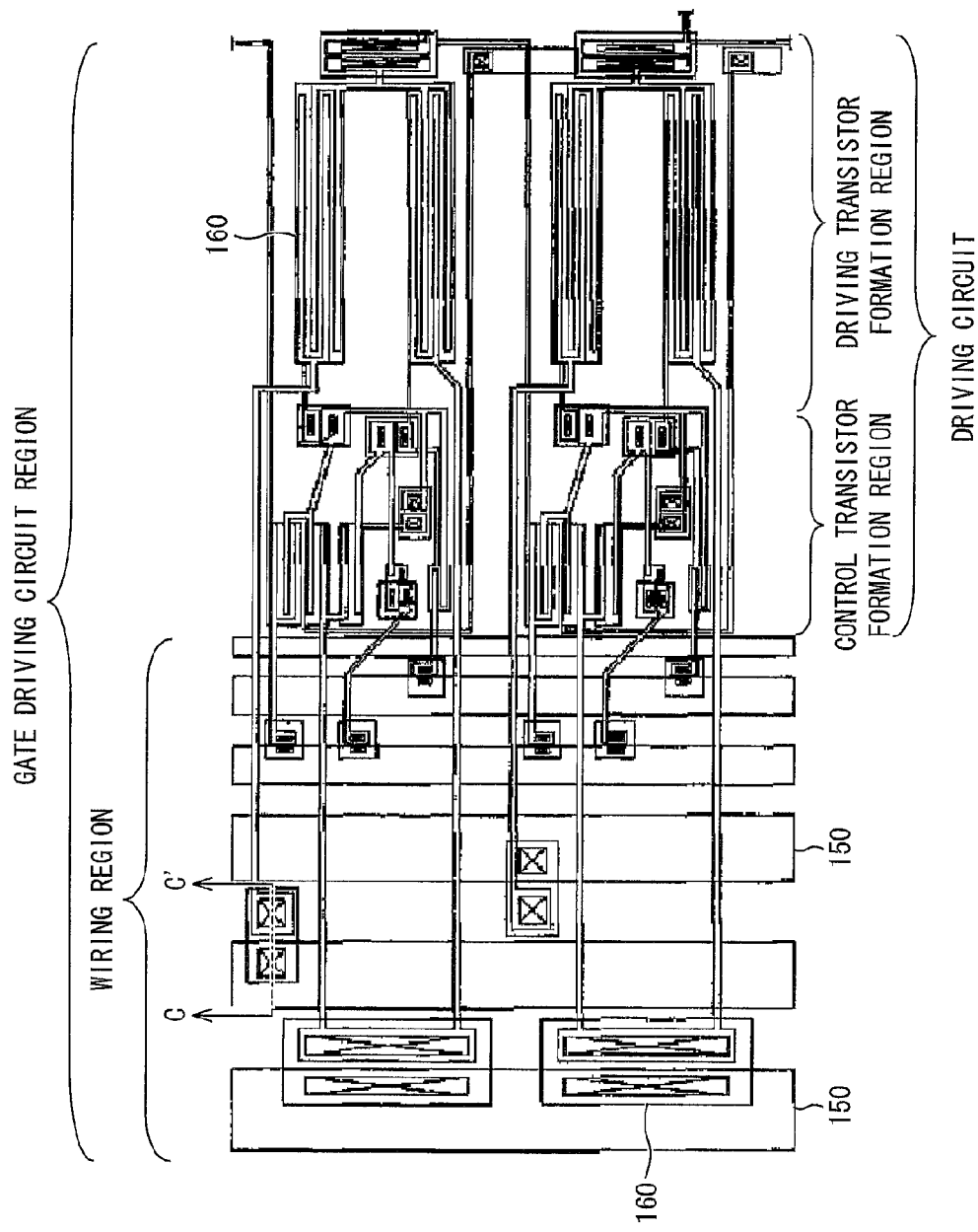
FIG. 12 is a plan view illustrating a gate driving circuit region of a substrate for a conventional liquid crystal display device.

FIG. 11 illustrates yet other signal wirings 13 for the gate driving circuit, provided on the TFT array substrate 1.

In Embodiments 1 to 3, the description was made assuming that the stem wirings 13a have a same width, whereas, in the present embodiment, one of the stem wirings 13' has a broader width, as illustrated in FIG. 11.

As illustrated in FIG. 11, the stem wiring 13a, 13a' located nearer to the gate driving circuit 11 has more intersection(s) with the branch wiring 13b and thus more loads. It is therefore preferable that the stem wiring 13a, 13a' located nearer to the gate driving circuit 11 has a narrower width.

The stem wiring 13a' located furthest from the gate driving circuit 11 never intersects with the branch wiring 13b, due to their arrangements. That is, the increase in the width of the stem wiring 13a' will not lead to an increase in capacitance in the intersection of the stem wiring 13a' and the branch wiring 13b. It is thus preferable to dispose the wiring whose resistance is to be lowered, at a place located furthest from the gate driving circuit 11. For example, a gate off potential relates to the leak current of the TFT when an applied voltage to liquid crystals for each pixel is maintained and to the display quality such as contrast deterioration or display unevenness. It is thus preferable to lower the resistance of a wiring for supplying the potential and to stabilize signals. That is, it is preferable to dispose the stem wiring for supplying the gate off potential at the place located furthest from the gate driving circuit 11.

Further, if the second stem wiring 15, the second branch wirings 15a, the third stem wiring 16, and the third branch wirings 16a as illustrated in FIG. 8 are additionally provided in the present embodiment, it is preferable that, in the intersection of (i) the branch wiring 13b and/or the second branch wirings 15a (not illustrated in FIG. 11) and (ii) the stem wiring 13a and/or the third stem wiring 16 (not illustrated in FIG. 11), the stem wiring 13a, the branch wiring 13b, the second branch wirings 15a and the third stem wiring 16 are provided with narrower widths so that the overlapping area of (i) the branch wiring 13b and/or the second branch wirings 15a and (ii) the stem wiring 13a and/or the third stem wiring 16, when seen in a plan view, is reduced.

According to the present embodiment, in the intersection of the stem wiring 13a and the branch wiring 13b, the stem wiring 13a is formed with a narrower line width, as illustrated in FIG. 11.

According to the configuration, since the stem wiring 13a is partially narrowed in so as to reduce the overlapping area of the stem wiring 13a and the branch wiring 13b in the intersection thereof, when seen in a plan view, the capacitance that may be occurred in the intersection can be suppressed.

As illustrated in FIG. 11, another wiring 19 may be formed between the gate driving circuit 11 and the five stem wirings (one wiring 13a' and four wirings 13a).

In other words, the five stem wirings (one wiring 13a' and four wirings 13a) may not necessarily be disposed directly adjacent to the gate driving circuit 11.

The another wiring 19 may be a wiring for repairs for a disconnected wiring in the display region, a test signal wiring, a counter (common) electrode wiring, a storage capacitor wiring, or the like.

In the above-described Embodiment 1, the contact hole 13h in the shape of rectangle is provided in the stem wiring 13a so as to uncover the branch wiring 13b, as illustrated in FIG. 3. While, in the present embodiment, a contact hole 20 in the different shape is provided in the stem wiring 13a, as illustrated in FIG. 11.

As explained above, the shape of the contact hole which is provided in the stem wiring 13a or in the gate insulating film 6 so as to uncover the branch wiring 13b is not particularly limited.

A liquid crystal display device as an example of the active matrix display device of the present invention is configured to comprise the TFT array substrate 1 described above.

As a result, a reliable active matrix display device having excellent display quality can be achieved.

Although the illustration is omitted, the liquid crystal display device includes, for example, a TFT array substrate 1 and a color filter substrate countered thereto, wherein a liquid crystal layer is enclosed between these substrates by a sealing material.

Although the liquid crystal display device has been described as an example of an active matrix display device, it is not limited thereto and the TFT array substrate 1 may of course be applied to other active matrix display device such as an organic EL display device.

Further, the above-described TFT array substrate 1 may be applied to, in addition to the display device, a read device such as an x-ray sensor.

In the active matrix substrate according to the present invention, it is preferable that the pixel electrodes are arranged higher than the stem wiring and the branch wirings, a through hole is provided in the stem wiring in such a manner that it overlaps at least partially with the contact hole, the branch wiring and the stem wiring are electrically connected with each other via the connecting conductor provided in the contact hole and the through hole, and the connecting conductor is made of a material of the same layer as the pixel electrodes.

According to the configuration, in a region where the stem wiring is connected to the branch wiring, the stem wiring and the branch wiring are connected via the same layer as the pixel electrodes.

Therefore, the stem wiring and the branch wiring can be connected without an additional process.

In the active matrix substrate according to the present invention, it is preferable that the connecting conductor is the stem wiring.

According to the configuration, in the region where the stem wiring is electrically connected to the branch wiring, the stem wiring and the branch wiring are connected via the stem wiring.

Since the stem wiring itself can be used to connect the stem wiring to the branch wiring, the connection of the stem wiring to the branch wiring can be achieved without an additional process.

Accordingly, in a photolithography process, neither a formation failure of a pixel electrode material nor a connection failure between the stem wiring and the branch wiring may occur, the connection failure being caused by disconnection of the pixel electrode material in a taper section of the contact hole.

Further, according to the configuration, no pixel electrode material is disposed in a peripheral region on the active matrix substrate, where the stem wiring is connected to the branch wiring.

Accordingly, even if a sealing material for combining the active matrix substrate to a counter substrate is provided on the peripheral region, a secondary contact failure can be prevented, which may be caused by a seal spacer in the sealing material.

Also, even if the sealing material includes a conductive material for supplying signals from the active matrix substrate to the counter substrate, a leakage failure can be prevented.

On the active matrix substrate according to the present invention, it is preferable that a plurality of the stem wirings are provided, one of the stem wirings that is located furthest from the driving circuit having a broader line width than that of other stem wirings.

The stem wiring located furthest from the driving circuit never intersects with the branch wiring, due to their arrangements. Therefore, the increase in the width of the stem wirings will not result in an increase in capacitance in the intersection of the stem wiring and the branch wiring.

According to the configuration, the stem wiring located furthest from the driving circuit is formed with a broad line width, so that the resistance of the stem wiring can be lowered.

In the active matrix substrate according to the present invention, it is preferable that the stem wiring located nearer to the driving circuit has a narrower line width.

Since the stem wiring located nearer to the driving circuit has more intersections with the branch wirings and thus more loads, the line width of the stem wiring can be made narrower so as to suppress the capacitance that may be occurred in the intersections.

In the active matrix substrate according to the present invention, it is preferable that a plurality of the stem wirings are provided, the stem wirings having a same width and being disposed linearly and parallel with a uniform space therebetween.

According to the configuration, if a sealing material of a type in which it is cured, for example, by an exposure to UV irradiated from the rear surface of the active matrix substrate is provided on the stem wiring, the UV irradiation dose to be irradiated to the sealing material would substantially be uniform because the plurality of stem wirings have a same width and are disposed linearly and parallel with a uniform space act as slits.

With the configuration, the sealing material can thus be cured uniformly and evenly.

In the active matrix substrate according to the present invention, it is preferable that the stem wiring is partially laminated with one or more wirings formed of the same layer as the branch wirings and/or the same layer as the pixel electrodes, and the stem wiring and the one or more wirings are electrically connected with each other.

According to the configuration, the stem wiring has partially a laminated structure, so that the resistance of the stem wiring can further be lowered.

As the result, the dimension of the wiring region can be reduced, which thereby makes it possible to downsize the display device.

In the active matrix substrate according to the present invention, it is preferable that, in a place located further from the driving circuit than the stem wiring located furthest from the driving circuit, a second stem wiring is provided, and the second stem wiring and a second branch wiring for electrically connecting the second stem wiring to the driving circuit are formed of the same layer as the branch wirings.

The second stem wiring never intersects with the branch wirings due to their arrangements, so that it can be formed of the same layer as the branch wirings.

According to the configuration, both of the second stem wiring and the second branch wiring for electrically connecting the second stem wiring to the driving circuit are formed of the same layer as the branch wirings, so that no contact hole for connecting the second stem wiring to the second branch wiring is required, which can further improve the yield.

Also, the second stem wiring and the second branch wiring for connecting the second stem wiring to the driving circuit are formed by patterning the same layer as the branch wirings, so that lowering of resistance can be achieved.

In the active matrix substrate according to the present invention, it is preferable that the second stem wiring is laminated with one or more wirings formed of the same layer as the stem wiring and/or the same layer as the pixel electrodes, and the second stem wiring and the one or more wirings are electrically connected with each other.

According to the configuration, the second stem wiring has the laminated structure, so that the resistance of the second stem wiring can further be lowered.

As the result, the dimension of the wiring region can be reduced, which thereby makes it possible to downsize the display device.

In the active matrix substrate according to the present invention, it is preferable that, in the intersection of (i) the branch wiring and/or the second branch wiring and (ii) the stem wiring, the respective wirings are narrowed in line widths so that an overlapping area of (i) the branch wiring and/or the second branch wiring and (ii) the stem wiring, when seen in a plan view, is reduced.

According to the configuration, the capacitance that may be occurred in the intersection can be suppressed.

In the active matrix substrate according to the present invention, it is preferable that, in a place located nearer to the driving circuit than the stem wiring located nearest to the driving circuit, a third stem wiring is provided, and the third stem wiring and a third branch wiring for electrically connecting the third stem wiring to the driving circuit are formed of the same layer as the stem wiring.

According to the configuration, the third branch wiring never intersect with the stem wiring due to their arrangements, so that the third branch wiring can be formed of the same layer as the stem wiring.

Both of the third stem wiring and the third branch wiring are formed of the same layer as the stem wiring, so that no contact hole for connecting the third stem wiring and the third branch wiring is required, which can further improve the yield.

If, for example, the transistor provided on the driving circuit is a bottom-gate type transistor, the third branch wiring can be connected to a source electrode or a drain electrode of the transistor without providing a separate switching member.

In the active matrix substrate according to the present invention, it is preferable that terminal sections electrically connected to the stem wirings respectively are formed of the same material, the terminal sections being for externally inputting signals.

In the active matrix substrate according to the present invention, it is preferable that terminal sections electrically connected to the stem wiring and the second stem wiring respectively are formed of the same material, the terminal sections being for externally inputting signals.

In the active matrix substrate according to the present invention, it is preferable that a terminal section is electrically connected to a third stem wiring located nearer to the driving circuit than the stem wiring located nearest to the driving circuit, and made of the same material as that of the terminal sections.

For the connection of the terminal sections to an external circuit for inputting signals to the terminal sections, conductive particles, for example, may be used. However, if the each terminal section has a different film structure, a problem may be caused that film thicknesses are varied and a contact failure is likely to occur.

Also, in a case in which an indentation test is performed for the conductive particles as a contact test, each of the terminal sections having a different film thickness would cause another problem that criterions for evaluation are complicated.

According to the configuration, all of the terminal sections are made of the same material, so that the above-mentioned problems do not occur.

In the active matrix substrate according to the present invention, it is preferable that each of the terminal sections includes an upper electrode formed of the same layer as the stem wiring or the same layer as the pixel electrodes, and a lower electrode formed of the same layer as the branch wirings, the upper electrode and the lower electrode being electrically connected with each other.

According to the configuration, since the upper electrode of the terminal section is formed of the same layer as the stem wiring or the pixel electrodes, and the lower electrode of the terminal section is formed of the same layer as the branch wirings, no additional process for forming the terminal sections is required.

In the active matrix substrate according to the present invention, it is preferable that the terminal sections and second terminal sections for externally inputting other signals are made of the same material.

According to the configuration, all of the terminal sections provided on the active matrix substrate are made of the same material, so that the above-mentioned problems of the occurrence of a contact failure and the complicated criterions for evaluation in an indentation test performed for the conductive particles do not occur.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The invention is applicable in an active matrix display device, in particular a liquid crystal display device or an organic EL display device.

The invention is further applicable in a read device such as an x-ray sensor.

REFERENCE SIGNS LIST

1 TFT array substrate (Active matrix substrate)
2 Pixel TFT element (TFT element)
3 Pixel electrode
4 Insulating substrate
5 Gate electrode layer (A plurality of electrode layers)
6 Gate insulating film (Insulating layer)
8 Source/drain electrode layer (A plurality of electrode layers)
11 Gate driving circuit (Driving circuit)
12 Second terminal section
13*a*, 13*a*' Stem wiring
13*b* Branch wiring
13*h* Contact hole, Through hole
13*h*' Second contact hole
14 Connecting conductor
15 Second stem wiring
15*a* Second branch wiring
16 Third stem wiring
16*a* Third branch wiring
17 Wiring
18 Terminal section
R1 Display region
R2 Peripheral region

The invention claimed is:

1. An active matrix substrate comprising:
an insulating substrate;
TFT elements formed on the insulating substrate;
a display region where pixel electrodes electrically connected to the TFT elements respectively are arranged in a matrix; and
a peripheral region where a driving circuit for driving the TFT elements is disposed,
the peripheral region representing a periphery of the display region and including a plurality of branch wirings electrically connected to the driving circuit and a stem wiring to which one of the branch wirings is electrically connected,
each of the TFT elements including a plurality of electrode layers,
the branch wirings and the stem wiring being formed of the same layers as the plurality of electrode layers,
the branch wirings being formed of an electrode layer arranged lower than an electrode layer forming the stem wiring, of the plurality of electrode layers that the each TFT element includes,
an insulating layer being disposed between the stem wiring and the branch wirings,
the stem wiring intersecting with another of the branch wirings,
in the intersection, the stem wiring having a line width that is broader than that of the branch wiring,
in a region where the stem wiring is electrically connected to the one of the branch wirings, the stem wiring overlapping with the one of the branch wirings, when seen in a plan view,
a contact hole being formed in the insulating layer so as to uncover the one of the branch wirings, and
the stem wiring and the one of the branch wirings being electrically connected with each other via a connecting conductor formed in the contact hole.

2. The active matrix substrate as set forth in claim 1, wherein:
in a place located further from the driving circuit than the stem wiring located furthest from the driving circuit, a second stem wiring is provided, and
the second stem wiring and a second branch wiring for electrically connecting the second stem wiring to the driving circuit are formed of the same layer as the branch wirings.

3. The active matrix substrate as set forth in claim 2, wherein:
terminal sections electrically connected to the stem wiring and the second stem wiring respectively are formed of the same material, the terminal sections being for externally inputting signals.

4. The active matrix substrate as set forth in claim 3, wherein:
a terminal section is electrically connected to a third stem wiring located nearer to the driving circuit than the stem wiring located nearest to the driving circuit, and made of the same material as that of the terminal sections.

5. The active matrix substrate as set forth in claim 2, wherein:
the second stem wiring is laminated with one or more wirings formed of the same layer as the stem wiring and/or the same layer as the pixel electrodes, and
the second stem wiring and the one or more wirings are electrically connected with each other.

6. The active matrix substrate as set forth in claim 5, wherein:
in the intersection of (i) the branch wiring and/or the second branch wiring and (ii) the stem wiring, the respective wirings are narrowed in line widths so that an overlapping area of (i) the branch wiring and/or the second branch wiring and (ii) the stem wiring, when seen in a plan view, is reduced.

7. The active matrix substrate as set forth in claim 1, wherein:
terminal sections electrically connected to the stem wirings respectively are formed of the same material, the terminal sections being for externally inputting signals.

8. The active matrix substrate as set forth in claim 7, wherein:
each of the terminal sections includes an upper electrode formed of the same layer as the stem wiring or the same layer as the pixel electrodes, and a lower electrode formed of the same layer as the branch wirings,
the upper electrode and the lower electrode being electrically connected with each other.

9. The active matrix substrate as set forth in claim 7, wherein:
the terminal sections and second terminal sections for externally inputting other signals are made of the same material.

10. The active matrix substrate as set forth in claim 1, wherein:
the pixel electrodes are arranged higher than the stem wiring and the branch wirings,
a through hole is provided in the stem wiring in such a manner that it overlaps at least partially with the contact hole,
the branch wiring and the stem wiring are electrically connected with each other via the connecting conductor provided in the contact hole and the through hole, and
the connecting conductor is made of a material of the same layer as the pixel electrodes.

11. The active matrix substrate as set forth in claim 1, wherein:
the connecting conductor is the stem wiring.

12. The active matrix substrate as set forth in claim 1, wherein:
a plurality of the stem wirings are provided, one of the stem wirings that is located furthest from the driving circuit having a broader line width than that of other stem wirings.

13. The active matrix substrate as set forth in claim 1, wherein:
the stem wiring located nearer to the driving circuit has a narrower line width.

14. The active matrix substrate as set forth in claim 1, wherein:
a plurality of the stem wirings are provided, the stem wirings having a same width and being disposed linearly and parallel with a uniform space therebetween.

15. The active matrix substrate as set forth in claim 1, wherein:
the stem wiring is partially laminated with one or more wirings formed of the same layer as the branch wirings and/or the same layer as the pixel electrodes, and
the stem wiring and the one or more wirings are electrically connected with each other.

16. The active matrix substrate as set forth in claim 1, wherein:
  in a place located nearer to the driving circuit than the stem wiring located nearest to the driving circuit, a third stem wiring is provided, and
  the third stem wiring and a third branch wiring for electrically connecting the third stem wiring to the driving circuit are formed of the same layer as the stem wiring.

17. An active matrix display device comprising an active matrix substrate as set forth in claim 1.

* * * * *